(12) United States Patent
Chia

(10) Patent No.: US 7,829,987 B2
(45) Date of Patent: Nov. 9, 2010

(54) CARRIER STRUCTURE EMBEDDED WITH SEMICONDUCTOR CHIPS AND METHOD FOR MANUFACTURING THE SAME

(75) Inventor: Kan-Jung Chia, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 474 days.

(21) Appl. No.: 11/907,986

(22) Filed: Oct. 19, 2007

(65) Prior Publication Data
US 2008/0150164 A1    Jun. 26, 2008

(30) Foreign Application Priority Data
Dec. 20, 2006    (TW) .............................. 95147926 A

(51) Int. Cl.
*H01L 21/00*    (2006.01)
(52) U.S. Cl. .................. 257/678; 257/679; 257/700
(58) Field of Classification Search ......... 257/678–679, 257/700
See application file for complete search history.

(56) References Cited

U.S. PATENT DOCUMENTS

| | | | | | |
|---|---|---|---|---|---|
| 6,709,898 | B1* | 3/2004 | Ma et al. | ..................... | 438/122 |
| 6,964,881 | B2* | 11/2005 | Chua et al. | ................. | 438/108 |
| 7,087,992 | B2* | 8/2006 | Chua et al. | ................. | 257/723 |
| 7,109,063 | B2* | 9/2006 | Jiang | .......................... | 438/118 |
| 7,135,780 | B2* | 11/2006 | Jiang | .......................... | 257/783 |
| 7,242,092 | B2* | 7/2007 | Hsu | ........................... | 257/723 |
| 7,273,770 | B2* | 9/2007 | Edelstein et al. | ............ | 438/126 |
| 7,312,101 | B2* | 12/2007 | Jiang et al. | ................. | 438/106 |
| 7,321,455 | B2* | 1/2008 | Kinsman | .................... | 359/245 |
| 7,329,949 | B2* | 2/2008 | Jiang et al. | ................... | 257/723 |
| 7,358,615 | B2* | 4/2008 | Heck et al. | ................... | 257/776 |
| 7,362,580 | B2* | 4/2008 | Hua et al. | .................... | 361/709 |
| 7,364,934 | B2* | 4/2008 | Street et al. | .................... | 438/66 |
| 7,417,299 | B2* | 8/2008 | Hu | ............................. | 257/528 |
| 7,446,402 | B2* | 11/2008 | Hsu | ........................... | 257/679 |
| 7,452,797 | B2* | 11/2008 | Kukimoto et al. | ........... | 438/612 |
| 7,498,606 | B2* | 3/2009 | Street et al. | .................... | 257/79 |
| 7,550,847 | B2* | 6/2009 | Jiang et al. | ................... | 257/738 |
| 7,582,961 | B2* | 9/2009 | Chia et al. | ................... | 257/698 |
| 7,608,923 | B2* | 10/2009 | Hsu | .......................... | 257/707 |
| 7,635,611 | B2* | 12/2009 | Jiang | .......................... | 438/109 |
| 7,655,500 | B2* | 2/2010 | Jiang et al. | ................... | 438/106 |
| 7,659,143 | B2* | 2/2010 | Tang et al. | ................... | 438/107 |
| 2004/0155325 | A1* | 8/2004 | Ma et al. | ..................... | 257/678 |
| 2006/0043549 | A1* | 3/2006 | Hsu | .......................... | 257/678 |
| 2006/0087037 | A1* | 4/2006 | Hsu | .......................... | 257/738 |
| 2006/0145328 | A1* | 7/2006 | Hsu | .......................... | 257/690 |

(Continued)

*Primary Examiner*—Laura M Menz
(74) *Attorney, Agent, or Firm*—Bacon & Thomas, PLLC

(57) ABSTRACT

Carrier structure embedded with semiconductor chips and method for manufacturing the same are disclosed. The carrier structure comprises a metal plate and pluralities of semiconductor chips. An adhesive material is disposed on both surfaces of the metal plate, and pluralities of cavities are formed through the metal plate. The semiconductor chips are embedded in the cavities and mounted in the metal plate. The semiconductor chips each have an active surface on which pluralities of electrode pads are disposed. A built-up structure is formed on the surface of the carrier structure and the active surfaces of the semiconductor chips, which has pluralities of conductive vias therein to conduct the semiconductor chips, and has pads thereon. Besides, the metal plate has an etching cavity between the semiconductor chips, and the etching cavity is filled with the adhesive material. The present invention solves the problem of metal burrs being formed when cutting.

5 Claims, 4 Drawing Sheets

U.S. PATENT DOCUMENTS

| | | | |
|---|---|---|---|
| 2006/0175692 A1* | 8/2006 | Hsu | 257/679 |
| 2006/0186531 A1* | 8/2006 | Hsu | 257/700 |
| 2006/0186536 A1* | 8/2006 | Hsu | 257/720 |
| 2007/0111398 A1* | 5/2007 | Hsu | 438/125 |
| 2008/0029895 A1* | 2/2008 | Hu et al. | 257/762 |
| 2008/0128865 A1* | 6/2008 | Chia | 257/620 |
| 2008/0179725 A1* | 7/2008 | Chia et al. | 257/676 |
| 2009/0045513 A1* | 2/2009 | Kim et al. | 257/738 |
| 2010/0006331 A1* | 1/2010 | Hsu | 174/260 |

* cited by examiner though the method of an uncon## CARRIER STRUCTURE EMBEDDED WITH SEMICONDUCTOR CHIPS AND METHOD FOR MANUFACTURING THE SAME

BACKGROUND OF THE INVENTION

1. Field of the Invention

The present invention relates to a carrier structure embedded with semiconductor chips and a method for manufacturing the same, and, more particularly, to a carrier structure used to avoid both a warp of the carrier structure and burr formation when cutting metal, and a method for manufacturing the same.

2. Description of Related Art

Customer demands of the electronics industry continue to evolve rapidly and the main trends are high integration and miniaturization. In order to satisfy those requirements, especially in the packaging of semiconductor devices, development of circuit boards with the maximum of active and passive components and conductive wires has progressed from single to multiple layer types. This means that a greater circuit layout area is available due to interlayer connection technology.

In the conventional semiconductor device, semiconductor chips are mounted on top of a substrate, and then processed in wire bonding, or connecting the semiconductor chip which has the solder bump thereon to the conductive pads on the substrate, followed by disposing solder balls on the bottom surface of the substrate to provide electrical connections for printed circuit board. Although an objective of high quantity pin counts is achieved, this condition is limited by way of long pathways of conductive circuits making electric characteristics unable to be improved in the high frequency and high-speed operating situations. Otherwise, the complexity of the manufacture is only relatively increased because too many connective interfaces are required for conventional semiconductor packages.

In many studies, semiconductor chips directly conducting to external electronic devices are embedded into a package substrate to shorten conductive pathways, decrease signal loss and distortion, and increase abilities of high-speed operation.

In a carrier structure embedded with a semiconductor chip, as shown in FIG. 1, metal layers 15 are disposed on electrode pads 13 of an active surface of the semiconductor chip 12 for preventing destruction of the semiconductor chip 12 in a carrier 11 by laser ablation to form via holes for manufacturing a circuit built-up structure 16. The carrier structure embedded with a semiconductor chip includes: a carrier 11, on which a cavity is formed; a semiconductor chip 12 which is placed in the cavity, and has a plurality of electrode pads 13 formed on an active surface thereof; a passivation layer 14 formed on the semiconductor chip 12, and accordingly exposing the a plurality of electrode pads 13; a plurality of metal layers 15 formed on surfaces of the electrode pads 13; and a built-up structure 16 formed on surfaces of the semiconductor chip 12 and the carrier 11. The built-up structure 16 is formed on the surfaces of the semiconductor semiconductor chip 12 and the carrier 11, and conducts to the electrode pads 13 of the semiconductor chip 12.

Currently, in a carrier structure embedded with semiconductor chips, the carrier is generally made of organic resins such as bismaleimide-triazine (BT), and then, that carrier is cut by a cutting tool to become a carrier structure having a single semiconductor chip. However, stress on the surface of the built-up structure and on that of the non-built-up structure is not the same. Because the built-up structure 16 is asymmetric, the carrier becomes warped. Under this condition, production becomes complex, and excessively warped carriers cause low yield and low stability of products. Alternatively, if the carrier is made of metal, it has better strength for anti-warp than the resin carrier. However, after the metal carrier is cut by a cutting tool, metal burrs will be generated thereby causing disadvantages such as poor appearance of the carrier structure and damage of the cutting tool, furthermore the metal burrs will also be generated thereby causing damage of the carrier structure embedded with semiconductor chips.

SUMMARY OF THE INVENTION

In view of the above conventional shortcomings, the present invention provides a carrier structure embedded with semiconductor chips, which comprises a metal plate and a plurality of semiconductor chips. There is an adhesive material disposed on both surfaces of the metal plate and a plurality of cavities formed through the metal plate. The semiconductor chips are embedded in the cavities, and mounted in the metal plate. Each of the semiconductor chips has an active surface on which pluralities of electrode pads are disposed. In addition, the metal plate has etching grooves each formed between the neighboring semiconductor chips, and the etching grooves are filled with the adhesive material. Furthermore, a built-up structure asymmetrically formed on the surface of the carrier structure and the active surfaces of the semiconductor chips does not cause a warp of the carrier structure, owing to the presence of the rigid metal plate. Herein, the built-up structure has a plurality of conductive vias therein so as to conduct the semiconductor chips, and further has pads formed on the surface thereof.

In the present invention, the semiconductor chips are retained in the metal plate by the adhesive material.

In the carrier structure of the present invention, the adhesive material disposed on the both surfaces of the metal plate can be the same or different adhesive material. Additionally, the adhesive material can be in any form as long as it is fluid under heating, but preferably is epoxy resin used to retain the semiconductor chips.

According to the carrier structure embedded with semiconductor chips of the present invention illustrated above, a method for manufacturing the same can comprise the following steps, but is not limited thereto.

First, a metal plate laminated with a first adhesive layer on a surface thereof and having a plurality of first cavities and a plurality of etching grooves is provided. A second adhesive layer is provided, and formed with second cavities corresponding to the first cavities of the metal plate. Then, a third adhesive layer is disposed on a surface of the second adhesive layer. Semiconductor chips each having an active surface and a non-active surface are mounted in the second cavities of the second adhesive layer by the third adhesive layer. Subsequently, the metal plate and the second adhesive layer are laminated together to fill the first and second cavities and the etching grooves with part material of the first and second adhesive layers. Then, the third adhesive layer is removed. Finally, a built-up structure is formed on the surface of the carrier structure and on the active surfaces of the semiconductor chips. Herein, the built-up structure has a plurality of conductive vias therein so as to conduct the semiconductor chips, and further has pads formed on the surface thereof.

In the method of the present invention, the etching grooves each are disposed between the neighboring semiconductor chips. Besides, the first adhesive layer is not penetrated by the etching grooves.

In the method of the present invention, the first and second cavities are formed through cutting at the same time.

Additionally, the adhesive material disposed on both surfaces of the metal plate is formed from the first and second adhesive layers in the method of the present invention. Besides, the adhesive material further comprises a thin metal layer disposed on the surface thereof. Preferably, the thin metal layer is made of Cu. The thin metal layer is used to enhance the structural strength of the metal plate, and to prevent the carrier structure becoming loosened due to incorrect operation while forming the etching grooves in the metal plate.

In the method of the present invention, the active or non-active surfaces of the semiconductor chips face to the third adhesive layer, and then the semiconductor chips are mounted in the second cavities of the second adhesive layer.

In the method of the present invention, the first and second cavities, and the etching grooves are filled with part material of the first and second adhesive layers by heating when laminating the metal layer and the second adhesive layer.

Furthermore, during the manufacturing of the carrier structure embedded with a semiconductor chip in the present invention, the third adhesive layer can be an adhesive material capable of being removed easily, such as a release film and an adhesive tape. Preferably, the third adhesive layer is a release film.

The metal plate in the present invention can be made of Al, Cu, Fe, or the alloys thereof. Preferably, the metal plate is made of Al. The metal plate is lighter and stronger than organic plates so as to prevent the carrier structure from being warped.

In the carrier structure and the method for manufacturing the same, the built-up structure comprises a dielectric layer, a circuit layer disposed on the dielectric layer, and the aforementioned conductive vias formed therein. Otherwise, a solder mask can be formed on the surface of the built-up structure. The solder mask has a plurality of openings formed on the surface thereof so as to exposed the pads of the built-up structure.

The carrier structure embedded with semiconductor chips illustrated above can be further separated by cutting along the etching grooves into each having a single semiconductor chip disposed with the built-up structure thereon.

In the above-mentioned openings of the solder mask, conductive elements can be formed to conduct the pads of the built-up structure. The conductive elements can be solder balls, metal bumps, or conductive adhesive materials.

Accordingly, the carrier structure in the present invention can be formed by way of attaching the metal plate and the adhesive material formed from the first and second adhesive layers to each other, and is advantageous for the subsequent manufacturing processes. The carrier structure of the present invention can prevent disadvantages, such as warps, due to the carrier structure being made of organic carriers, and also avoid metal burrs being generated when the carrier structure is made of metal plates. Furthermore, a built-up structure asymmetrically formed on the surface of the carrier structure and the active surfaces of the semiconductor chips does not cause a warp of the carrier structure, owing to the presence of the rigid metal plate. Herein, the built-up structure has a plurality of conductive vias therein so as to conduct the semiconductor chips, and further has pads formed on the surface thereof.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
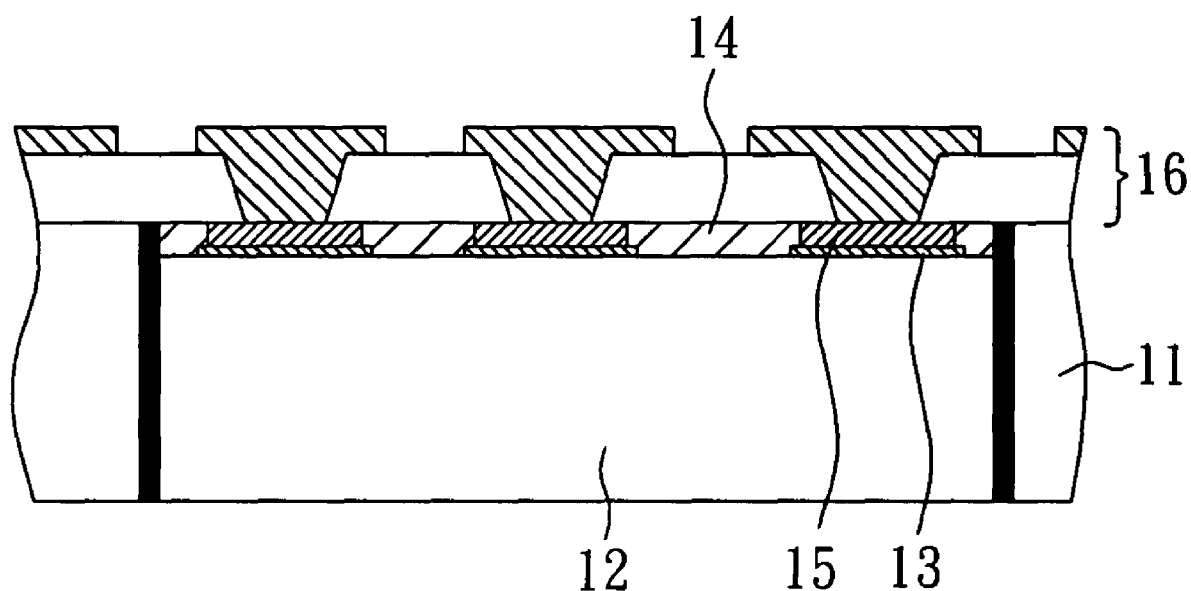
FIG. 1 is a cross-sectional view of a conventional carrier structure embedded with semiconductor chips.

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only exposed elements relative to the present invention. The elements revealed in the drawings are not necessarily aspects of the practice, and quantity and shape thereof are optionally designed. Further, the design aspect of the elements can be more complex.

Embodiment 1

Figure 2A:
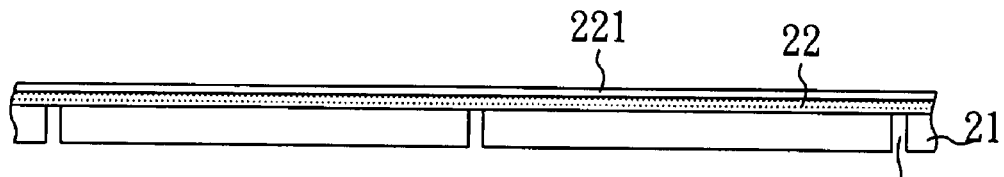
FIGS. 2A to 2E show a flow chart in cross-sectional views for manufacturing a carrier structure embedded with semiconductor chips in the present invention.

With reference to FIGS. 2A to 2E, there is shown a flow chart in cross-sectional views for manufacturing a carrier structure embedded with semiconductor chips in the present invention. As shown in FIG. 2A, first, a metal plate 21 made of Al is provided, which is laminated with a first adhesive layer 22 on a surface thereof. Besides, a thin metal layer 221 is formed on the surface of the first adhesive layer 22. The first adhesive layer 22 is a resin capable of flowing under heating. In this embodiment, epoxy resin is used as the first adhesive layer 22, and the thin metal layer 221 is made of Cu. Additionally, the metal plate 21 have a plurality of etching grooves 211 formed by etching.

Figure 2B:
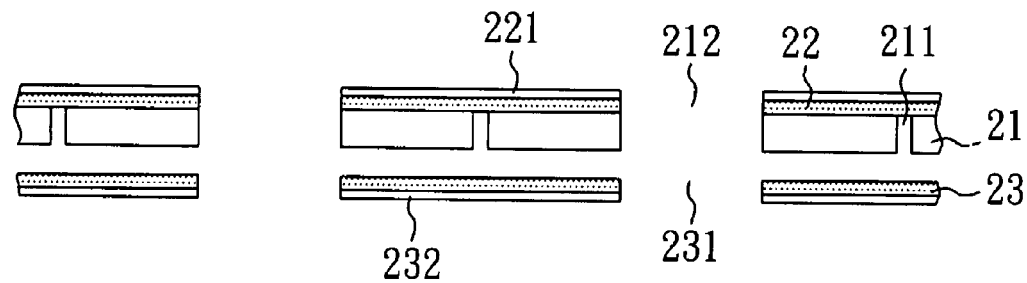

In FIG. 2B, the metal plate 21 having the first adhesive layer 22 and the thin metal layer 221 is cut to form a plurality of first cavities 212. Then, a second adhesive layer 23 is provided on which a thin metal layer 232 is formed. The second adhesive layer 23 is the same as the first adhesive layer 22 in the capability of being fluid under heating, such as epoxy resin. Then, second cavities 231 corresponding to the first cavities 212 of the metal plate 21 are formed by cutting the second adhesive layer 23 and the thin metal layer 232.

Figure 2C:
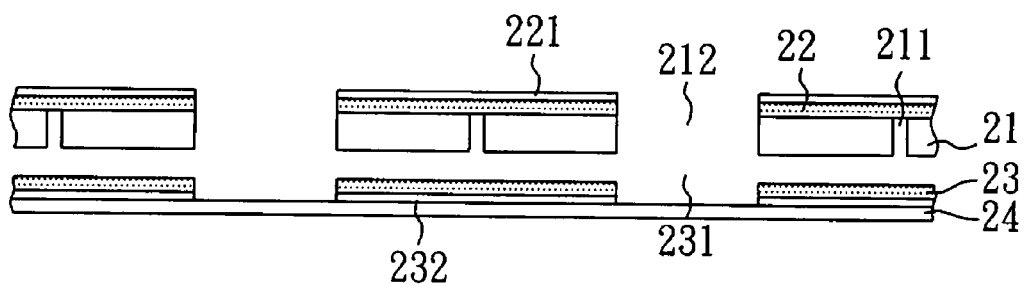

As shown in FIG. 2C, a third adhesive layer 24 is attached on a surface of the thin metal layer 232 of the second adhesive layer 23. The third adhesive layer 24 has capability of being easily removed. In this embodiment, a release film is used as the third adhesive layer 24.

Figure 2D:
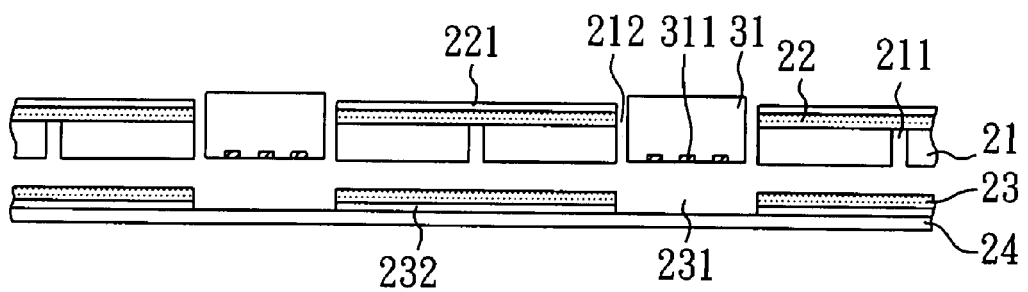

With reference to FIG. 2D, semiconductor chips 31 each having an active surface and a non-active surface are put into the first cavities 212 of the metal plate 21. In addition, the active surfaces of the semiconductor chips 31 face to the third adhesive layer 24, and a plurality of electrode pads 311 are located thereon. By the third adhesive layer 24, the semiconductor chips 31 are temporarily located in the second cavities 231 of the second adhesive layer 23 having the thin metal layer 232.

Subsequently, the second adhesive layer 23 having the thin metal layer 232 thereon and the metal plate 21 are laminated together under heating. At the same time, the first cavities 212, the second cavities 213, and the etching grooves 211 are filled with part material of the first adhesive layer 22 and the second adhesive layer 23. Therefore, the first adhesive layer 22 and the second adhesive layer 23 can be used to fasten the semiconductor chips 31 directly, and the part material thereof filling into the etching groove 211 also can be advantageous to the subsequent manufacturing processes of separating the carrier structure into each having a single semiconductor chip without generation of burrs. Finally, the third adhesive layer 24 is removed. The carrier structure embedded with semiconductor chips in the present invention is obtained as shown in FIG. 2E.

Figure 2E:
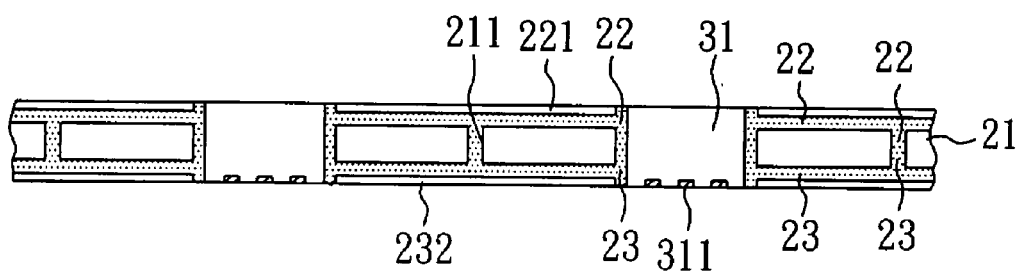

Hence, the present invention provides a carrier structure embedded with semiconductor chips as shown in FIG. 2E, which comprises a metal plate 21 and a plurality of semiconductor chips 31. There is an adhesive material disposed on both surfaces of the metal plate 21 and a plurality of cavities (i.e. the first cavities 212 and the second cavities 231 as shown in FIG. 2D) formed through the metal plate 21. Furthermore, the adhesive material is formed from the first adhesive layer 22 and the second adhesive layer 23. The semiconductor chips 31 are embedded in the cavities, and mounted in the metal plate 21. Each of the semiconductor chips 31 has an active surface on which pluralities of electrode pads 311 are disposed. In addition, the metal plate 21 has etching grooves 211 each between the neighboring semiconductor chips 31, and the etching grooves 211 are filled with the adhesive material. The adhesive material in the etching grooves 211 are formed from part of the first adhesive layer 22 and the second adhesive layer 23 when laminating under heating.

Besides, the thin metal layer 221, 232 in the present embodiment can be processed into part of circuits (figures not shown) in the structure if necessary.

Figure 2F:
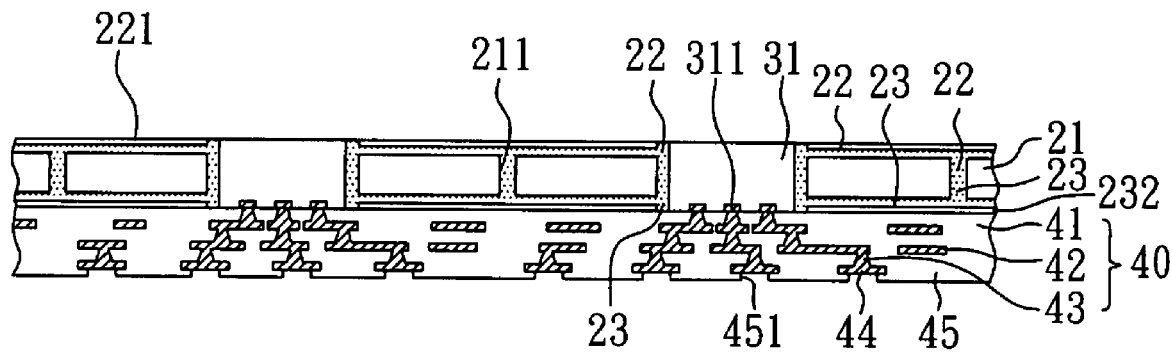
FIGS. 2F to 2H show cross-sectional views for manufacturing a built-up structure of the carrier structure embedded with semiconductor chips in the present invention.
Figure 2G:
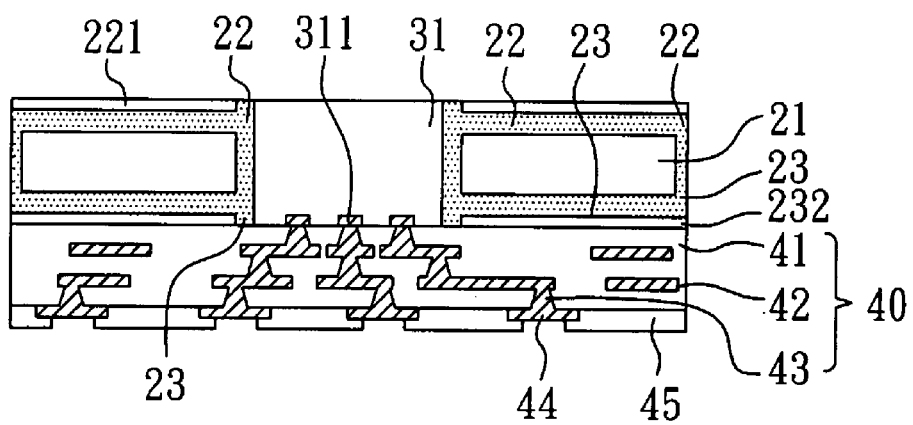
Figure 2H:
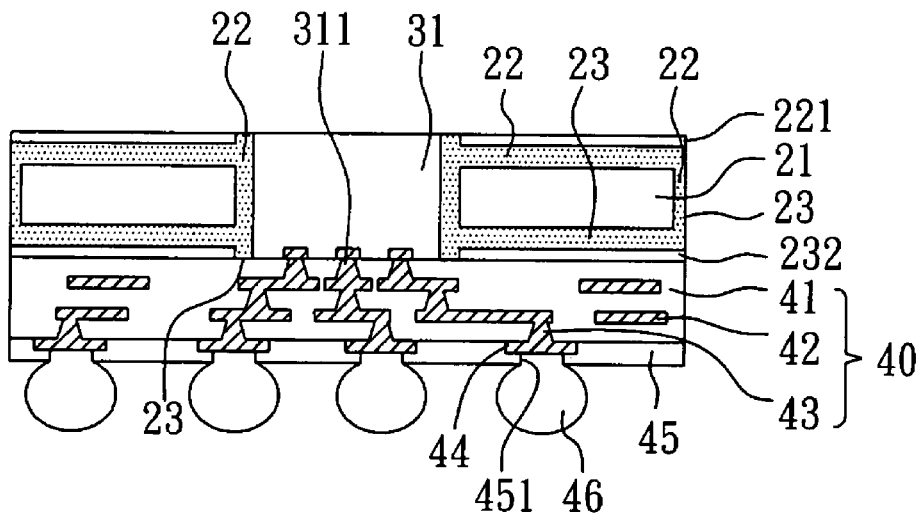

With reference to FIGS. 2F to 2H, there is a flow chart in cross-sectional views for manufacturing a package substrate from the carrier structure embedded with the semiconductor chips illustrated above. As shown in FIG. 2F, through the built-up process, a built-up structure 40 is formed on the active surfaces of the semiconductor chips 31 and on the surface of the carrier structure embedded with the semiconductor chips 31. The built-up structure 40 can be formed on only one surface or on both surfaces of the carrier structure. Furthermore, the built-up structure 40 has a dielectric layer 41, a circuit layer 42, and conductive vias 43. The circuit layer 42 is disposed on the dielectric layer 41, and that is formed by exposure and development of a resistive layer (figures not shown) and then plating. The conductive vias 43 are formed as follows: vias (figures not shown) are formed through laser ablation the dielectric layer 41, and at the same time of plating the circuit layer 42, the conductive vias 43 are formed through plating. Besides, the conductive vias 43 connect to the electrode pads 311 of the semiconductor chips 31. Pluralities of pads 44 are formed on the surface of the built-up structure 40. In addition, a solder mask 45 is formed on the outer surface of the built-up structure 40. The solder mask 45 has a plurality of openings 451 so as to expose the pads 44 of the built-up structure 40.

Then, through cutting along the etching grooves 211, the carrier structure is separated into each having a single semiconductor chip 31 disposed with the built-up structure 40 thereon (FIG. 2G). Besides, part of the adhesive material of the first adhesive layer 22 and the second adhesive layer 23 is retained surrounding the separated carrier structures each having the single semiconductor chip 31 embedded in the metal plate 21 after separation.

Finally, as shown in FIG. 2H, conductive elements 46 such as solder balls conducting the pads 44 are formed in the openings 451 of the solder mask 45 on the surface of the separated carrier structure having the single semiconductor chip 31. The conductive elements 46 can also be metal bumps or other conductive adhesive materials.

Embodiment 2

Figure 3A:
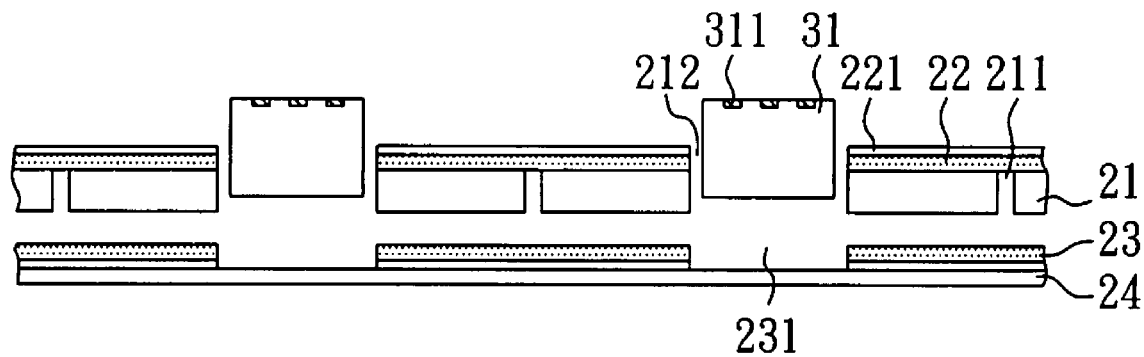
FIGS. 3A to 3B show a flow chart in cross-sectional views for manufacturing a carrier structure embedded with semiconductor chips in the present invention.
Figure 3B:
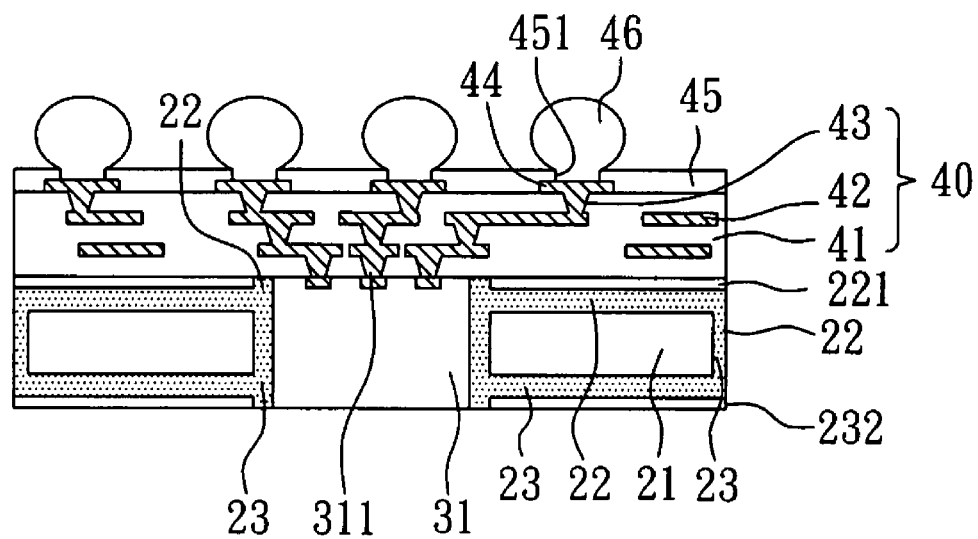

With reference to FIGS. 3A and 3B, there are carrier structures embedded with semiconductor chips in cross-sectional view in the present embodiment. As shown in FIG. 3A, the present embodiment is approximately similar to Embodiment 1 except the non-active surfaces of the semiconductor chips 31 face to the third adhesive layer 24 and the semiconductor chips 31 are temporarily adhered on the surface of the third adhesive layer 24. Other steps of the present embodiment are the same as those of Embodiment 1. Hence, the structure as shown in FIG. 3B can be afforded.

In conclusion, in the present invention, the metal plate and the adhesive material of the first and second adhesive layers are used so that the etching grooves can be filled with the adhesive material to fasten the semiconductor chips. Through cutting along the etching grooves, the carrier structure is separated into each separated carrier structure having a single semiconductor chip. Therefore, the disadvantages, such as warps due to the carrier structure being made of organic carriers and metal burrs being generated because the carrier structure is made of metal plates can be avoided so as to benefit the subsequent manufacturing processes. In addition, a built-up structure asymmetrically formed on the surface of the carrier structure and the active surfaces of the semiconductor chips does not cause a warp of the carrier structure, owing to the presence of the rigid metal plate. Herein, the built-up structure has a plurality of conductive vias therein so as to conduct the semiconductor chips, and further has pads formed on the surface thereof.

Although the present invention has been explained in relation to its preferred embodiment, it is to be understood that many other possible modifications and variations can be made without departing from the scope of the invention as hereinafter claimed.

What is claimed is:

1. A carrier structure embedded with semiconductor chips comprising:
    a metal plate having a first surface, an opposite second surface, and a plurality of etching grooves penetrating therethrough;
    an adhesive material is disposed on the first and second surfaces of the metal plate, wherein the etching grooves of the metal plate are filled with the adhesive material;
    a first thin metal layer and a second thin metal layer arranged respectively on the adhesive material disposed on the first and second surfaces of the metal plate;

a plurality of cavities penetrating through the metal plate, the first and second thin metal layers, and the adhesive material, wherein each of the etching grooves of the metal layer locates between two neighboring cavities;

a plurality of semiconductor chips embedded in the cavities, mounted in the metal plate, and each having an active surface on which a plurality of electrode pads are disposed, wherein a gap between one semiconductor chip and one cavity is filled with the adhesive material; and a built-up structure formed on the surface of the carrier structure and on the active surfaces of the semiconductor chips, wherein the built-up structure has a plurality of conductive vias therein so as to conduct the semiconductor chips, and has pads formed on the surface thereof.

2. The carrier structure as claimed in claim 1, wherein the semiconductor chips are retained in the metal plate by the adhesive material.

3. The carrier structure as claimed in claim 1, wherein the metal plate is made of Al, Cu, Fe, or the alloy thereof.

4. The carrier structure as claimed in claim 1, wherein the built-up structure comprises a dielectric layer, a circuit layer disposed on the dielectric layer, and the conductive vias formed therein.

5. The carrier structure as claimed in claim 1, further comprising a solder mask formed on the surface of the built-up structure, wherein the solder mask has a plurality of openings formed on the surface thereof so as to expose the pads of the built-up structure.

* * * * *